US010714815B2

(12) United States Patent
Troxel

(10) Patent No.: US 10,714,815 B2
(45) Date of Patent: Jul. 14, 2020

(54) SYSTEMS AND METHODS FOR PROVIDING A DME L-BAND SHARED ANTENNA

(71) Applicant: Aviation Communication & Surveillance Systems, LLC, Phoenix, AZ (US)

(72) Inventor: James R. Troxel, Glendale, AZ (US)

(73) Assignee: AVIATION COMMUNICATION & SURVEILLANCE SYSTEM LLC, Phoenix, AZ (US)

( * ) Notice: Subject to any disclaimer, the term of this patent is extended or adjusted under 35 U.S.C. 154(b) by 454 days.

(21) Appl. No.: 15/464,182

(22) Filed: Mar. 20, 2017

(65) Prior Publication Data
US 2017/0271755 A1     Sep. 21, 2017

Related U.S. Application Data

(60) Provisional application No. 62/310,245, filed on Mar. 18, 2016.

(51) Int. Cl.
*H01Q 1/28* (2006.01)
*G01S 13/78* (2006.01)
(Continued)

(52) U.S. Cl.
CPC .......... *H01Q 1/286* (2013.01); *G01S 5/0009* (2013.01); *G01S 7/03* (2013.01); *G01S 13/781* (2013.01);
(Continued)

(58) Field of Classification Search
CPC .......... G01S 13/91; G01S 19/15; G01S 3/043; G01S 13/781; G01S 13/785; G01S 7/03;
(Continued)

(56) References Cited

U.S. PATENT DOCUMENTS 4,138,678 A * 2/1979 Kirner ............... G01S 1/022
342/169
6,466,773 B1 * 10/2002 Johnson ............. H04B 1/18
455/132
(Continued)

FOREIGN PATENT DOCUMENTS

EP    1901087     3/2008
EP    1975643     10/2008

OTHER PUBLICATIONS

Notification of Transmittal of the International Search Report and the Written Opinion of the International Searching Authority, or the Declaration, dated Jun. 22, 2017 for related international application PCT/US2017/023243.

*Primary Examiner* — Olumide Ajibade Akonai
(74) *Attorney, Agent, or Firm* — Dickinson Wright PLLC

(57) ABSTRACT

Various wireless systems may benefit from suitable sharing of antennas and related equipment. For example a various avionics systems may benefit from systems and methods for providing a distance measurement equipment L-band shared antenna. Circuitry can include an interface to a bottom omni-directional antenna. The circuitry can also include a radio frequency splitter in switchable communication with the interface to the bottom omni-directional antenna. The circuitry can further include an interface between the radio frequency splitter and a distance measurement equipment receiver. The circuitry can additionally include an interface between the radio frequency splitter and a surveillance receiver.

10 Claims, 2 Drawing Sheets

(51) Int. Cl.
*G08G 5/00* (2006.01)
*G01S 7/03* (2006.01)
*G01S 5/00* (2006.01)
*G01S 13/933* (2020.01)
*H01Q 5/50* (2015.01)
*H01P 5/19* (2006.01)
*H03F 3/19* (2006.01)
*H03F 3/20* (2006.01)

(52) U.S. Cl.
CPC .......... *G01S 13/785* (2013.01); *G01S 13/933* (2020.01); *G08G 5/0004* (2013.01); *H01P 5/19* (2013.01); *H01Q 5/50* (2015.01); *H03F 3/19* (2013.01); *H03F 3/20* (2013.01); *H03F 2200/451* (2013.01)

(58) Field of Classification Search
CPC .......... G01S 13/933; G01S 1/02; G01S 13/86; G01S 7/034; G01S 7/282; G01S 7/4021; G01S 5/0009; H04B 7/0817; H04B 7/0825; H04B 1/18; H04B 1/44; H04B 7/18506; H01Q 5/50; H01Q 1/286; H03F 3/20; H03F 2200/451; G08G 5/0004
See application file for complete search history.

(56) References Cited

U.S. PATENT DOCUMENTS

| | | | |
|---|---|---|---|
| 2002/0003491 A1* | 1/2002 | Heppe | H01Q 1/282 342/357.48 |
| 2004/0252046 A1* | 12/2004 | Mork | G01S 7/003 342/29 |
| 2007/0200741 A1* | 8/2007 | Hunter | H04B 1/0007 341/126 |
| 2008/0238759 A1* | 10/2008 | Carocari | G01S 13/785 342/47 |
| 2009/0027254 A1 | 1/2009 | Troxel | |
| 2013/0015998 A1* | 1/2013 | Jones | G01S 13/9303 342/30 |
| 2013/0121219 A1* | 5/2013 | Stayton | H04B 7/18506 370/310 |

\* cited by examiner

SYSTEMS AND METHODS FOR PROVIDING A DME L-BAND SHARED ANTENNA

CROSS-REFERENCE TO RELATED APPLICATION

This application is related to and claims the benefit and priority of U.S. Provisional Patent Application No. 62/310,245, filed Mar. 18, 2016, the entirety of which is hereby incorporated herein by reference.

BACKGROUND

Field

Various wireless systems may benefit from suitable sharing of antennas and related equipment. For example a various avionics systems may benefit from systems and methods for providing a distance measurement equipment L-band shared antenna.

Description of the Related Art

Current L-Band avionics system functions, such as traffic alert and collision avoidance system (TCAS), Mode S transponders, air traffic control radar beacon system (AT-CRBS) transponders, automatic dependent surveillance-broadcast (ADS-B) IN or OUT and distance measuring equipment (DME), provide stand-alone or integrated functional architectures where each single functional unit or integrated functional unit also contains the radio frequency (RF) function or functions. This architecture requires an RF interface to a single or multiple coaxial cables that interconnect the RF function to an antenna. However, in prior implementations, separate antennae are required to support the various avionics frequencies and functions, and location on the aircraft for the required functionality can create additional installation/wiring complexity, weight, and cost. Therefore, it would be desirable to selectively share the use of antennae mounted on an aircraft to reduce the complexity cost, yet prior approaches failed to produce practicable solutions to achieve this result.

SUMMARY

According to certain embodiments, circuitry can include an interface to a bottom omni-directional antenna. The circuitry can also include a radio frequency splitter in switchable communication with the interface to the bottom omni-directional antenna. The circuitry can further include an interface between the radio frequency splitter and a distance measurement equipment receiver. The circuitry can additionally include an interface between the radio frequency splitter and a surveillance receiver.

Various embodiments include circuitry, that may comprise an interface to a bottom omni-directional antenna; a radio frequency splitter in switchable communication with the interface to the bottom omni-directional antenna; an interface between the radio frequency splitter and a distance measurement equipment receiver; and an interface between the radio frequency splitter and a surveillance receiver. This antenna may comprise an antenna of any type or capable of operating through any desired frequency range, in in one case, the omni-directional antenna of the present invention comprises an L-band antenna. Further, the circuitry of claim 1, wherein the circuitry is configured to operate selectively in a surveillance transmit mode, a distance measurement equipment transmit mode, and a receive mode, and in additional implementations, the circuitry may further comprise a plurality of diodes configured to permit operation over a communication path based on the selected surveillance transmit mode, distance measurement equipment transmit mode, or receive mode. There are further embodiments provided that provide logic configured to prevent mutual transmission from a surveillance transmitter and a distance measurement equipment transmitter. In another embodiment, the circuitry may further comprise an interface to a surveillance transmitter, wherein the interface to the surveillance transmitter is switchably connected to the interface to the bottom omni-directional antenna. In yet another embodiment, the circuitry may further comprise an interface to a power amplifier of the distance measurement equipment, wherein the interface to the power amplifier is switchably connected to the interface to the bottom omni-directional antenna. In alternative implementations, the circuitry may include surveillance logic configured to arbitrate transmission between a surveillance transmitter and a distance measurement equipment transmitter, and in yet other implementations, may comprise: a low pass filter at the interface to the bottom omni-directional antenna. Additional embodiments of the present invention include a bandpass filter between the radio frequency splitter and the bottom omni-directional antenna. In yet another implementation, the surveillance receiver of the present invention comprises at least one a traffic collision avoidance system receiver or a transponder receiver.

BRIEF DESCRIPTION OF THE DRAWINGS

For proper understanding of the invention, reference should be made to the accompanying drawings, wherein.

DETAILED DESCRIPTION

Figure 1:
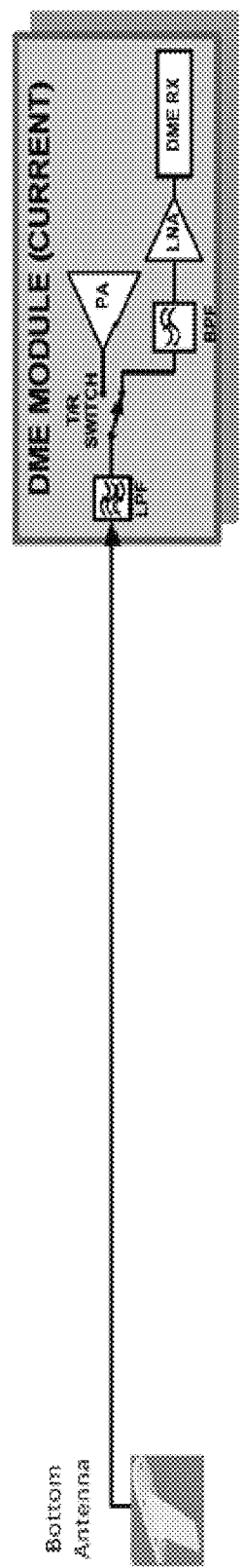
FIG. 1 illustrates a distance measurement equipment module and bottom antenna.

FIG. 1 illustrates a distance measurement equipment module and bottom antenna. As shown in FIG. 1, a current distance measurement equipment (DME) module can include a low pass filter (LPF) at an interface to a bottom antenna. The module can also include a power amplifier for a transmitter selectable connected to the low pass filter, using a transmit/receive (T/R) switch. In the receive position, the switch can further connect the low pass filter to a band pass filter (BPF). The band pass filter can provide a signal to a low noise amplifier (LNA). The amplifier can then provide the received signal to a distance measurement equipment receiver (RX).

Figure 2:
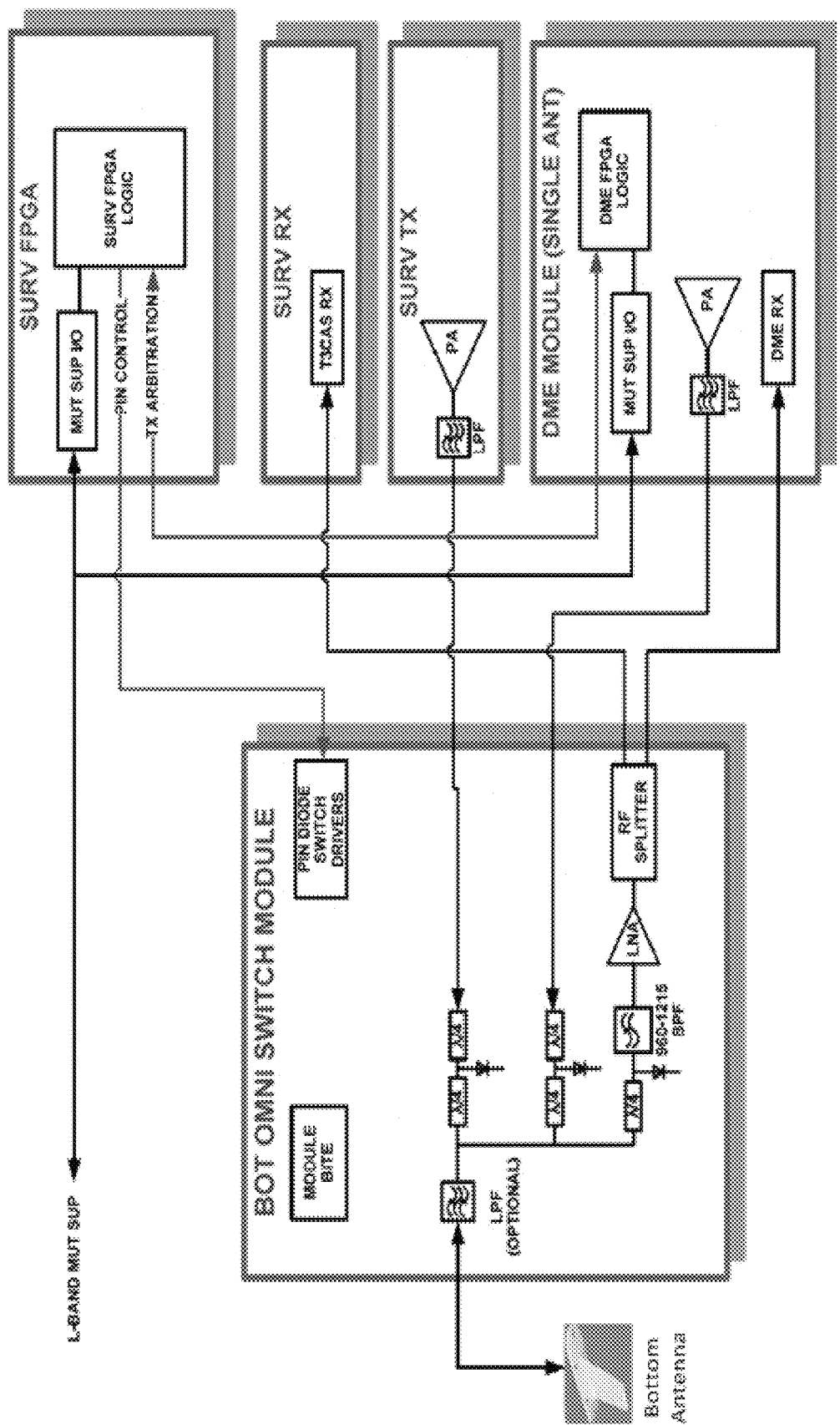
FIG. 2 illustrates a system according to certain embodiments of the present invention.

FIG. 2 illustrates a system according to certain embodiments of the present invention. For example, FIG. 2 provides a simplified block diagram showing an embodiment of the present invention for sharing a bottom omni-directional antenna between distance measuring equipment (DME) and surveillance (SURV) functions through the use of a switch module.

The switch module is labelled as a bottom (BOT) omni-directional (OMNI) switch module. The module can include built-in test equipment (BITE). Optionally, a low pass filter (LPF) can be provided at an interface to a bottom antenna. The bottom antenna may be an omni-directional antenna, such as an L-band antenna.

There can be three paths from the LPF or interface that can be terminated with a respective quarter-wave ($\lambda/4$) impedance transformer and diode switch. The three paths of the radio frequency (RF) switch may connect the external bottom omni-directional antenna respectively to the SURV transmitter (TX), the DME TX, and the SURV and the DME receivers. The switch may operate in at least 3 modes: (1) surveillance transmit, (2) DME transmit and (3) receive.

The first path and the second path can each include on the other side of the diode switch another quarter-wave impedance transformer. The first path can then interface to a surveillance transmitter module. The second path, similarly, can then interface to a DME module, particularly to a transmitter portion thereof.

The third path can include, after the diode switch, a band pass filter (BPF). The band may correspond to the intended reception bandwidth, such as 960 MHz to 1215 MHz. The 960-1215 MHz band is a portion of the L-band, which has been allocated for aeronautical radionavigation service (ARNS), and consequently can be used by distance measuring equipment, tactical air navigation, secondary surveillance radio, military identification friend or foe (IFF), and the like.

The third path can also include a low noise amplifier (LNA), which can feed the received and filter signal from the bottom antenna in amplified form to an RF splitter. A first branch of the RF splitter can interface to a surveillance receiver module, while a second branch of the RF splitter can interface to the DME module, particularly to a receiver portion thereof.

The surveillance receiver module can include, for example, a T3CAS™ receiver module, available from ACSS of Phoenix, Ariz. For example, the surveillance receiver module can include a traffic and collision avoidance system (TCAS), terrain awareness warning system (TAWS), and transponder functions. These may be provided as one line replaceable unit (LRU). It may also interface to a surveillance receiver module which contains UAT Transceiver functions at 978 MHz.

The surveillance transmitter module can include a power amplifier (PA) and a low pass filter. The power amplifier may be provided with inputs from the surveillance transmitter's processor, not shown. Furthermore, as the surveillance transmitter can similarly include multiple functional components, such as functional components for providing various services, including, but not limited to TCAS and transponder functions.

The DME module can include a DME receiver and a DME transmitter. The DME transmitter can, like the surveillance transmitter, include a power amplifier and a low pass filter. The DME module can be configured to use a single antenna, which can be the bottom antenna shown in this figure.

The DME module can also include a line for mutual suppression (MUT SUP) for communication on the L-band. The line can include a mutual suppression input/output (I/O) module. The mutual suppression input/output module can be connected to DME field programmable gate array (FPGA) logic. The DME FPGA logic can also be connected by a line to a surveillance FPGA for transmission arbitration.

The surveillance FPGA can include at least three interfaces. The first interface can be for mutual suppression and can be served by a mutual suppression input/output module. The mutual suppression input/output module can communicate with surveillance FPGA logic.

A second interface can be for transmission arbitration. This interface can communicate with the corresponding interface at the DME module, as described above.

A third interface of the surveillance FPGA can communicate with the switch module. This interface can provide control from the surveillance FPGA logic to the switch module.

Thus, the switch module can include a module for PIN diode switch drivers, which can be controlled by the surveillance FPGA. This module can control the diode switches for the three paths of the switch module, as described above. A PIN diode can be a diode that includes a stack of P-type, intrinsic, and N-type semiconductor material.

The OMNI switch module and related cabling and circuitry may replace a transmit/receive (T/R) switch on the SURV and the DME modules, as contrasted, for example, to FIG. 1. The SURV and DME modules transmitter may be connected to the switch through a coaxial (coax) cable. The SURV and DME receivers may be connected through additional coax cables.

When either the SURV or DME is transmitting, the PIN diode may switch connect the active transmitter to the omni-directional antenna. However, during reception, the omni-directional antenna may connect to both systems' receivers. In order to provide adequate signal sensitivity, the bottom omni switch module may have an additional BPF and LNA, whose output may be split and connected to both receivers. The system may utilize at least three PIN diode switches and drivers.

For a system design in which SURV and DME do not share the same antenna, the SURV and DME systems may utilize a mutual suppression bus to control transmission and arbitration characteristics for those functions which may include the potential for SURV and DME systems transmitting (TX) at the same time under some conditions. For a single antenna system, the simultaneous transmission from both DME and SURV functions may not be acceptable, and the mutual suppression bus alone may not be deemed to provide adequate coordination between the two functions to prevent this from occurring.

Several discrete signals may be used to ensure no simultaneous transmissions occur between the DME and surveillance functions. For example, a discrete signal output from the DME module may be used, which may be equivalent to the signal driving the mutual suppression bus. Another signal may be used as well, which may be an input to the DME to delay transmissions, similar to how mutual suppression works in a multiple antenna system.

One manner for providing control to prevent simultaneous transmission may be to have the SURV function provide the assurance that the DME function cannot inadvertently control the transmitter and receiver. the SURV function may be at a higher Design Assurance Level (DAL), for example DAL B, than the DME, for example DAL C.

There may be a number of different ways to implement preventing simultaneous transmission of the SURV and the DME RF signal outputs. Nevertheless, in certain embodiments a basic control mechanism, regardless of implementation, can be used to prevent attempts at multiple systems simultaneously transmitting on a single antenna.

Certain embodiments of the present invention can include circuitry. The circuitry can include an interface to a bottom omni-directional antenna. The circuitry can also include a radio frequency splitter in switchable communication with the interface to the bottom omni-directional antenna. The circuitry can further include an interface between the radio frequency splitter and a distance measurement equipment receiver. Furthermore, the circuitry can include an interface between the radio frequency splitter and a surveillance receiver.

The circuity can be configured to operate selectively in a surveillance transmit mode, a distance measurement equipment transmit mode, and a receive mode. For example, there can be a plurality of diodes configured to permit operation over a communication path based on the selected surveillance transmit mode, distance measurement equipment transmit mode, or receive mode. These may be PIN diodes, for example.

The circuitry can also include logic configured to prevent mutual transmission from a surveillance transmitter and a distance measurement equipment transmitter.

Additionally, the circuitry can include an interface to a surveillance transmitter. The interface to the surveillance transmitter can be switchably connected to the interface to the bottom omni-directional antenna.

The circuitry can also include an interface to a power amplifier of the distance measurement equipment. The interface to the power amplifier can be switchably connected to the interface to the bottom omni-directional antenna.

The circuitry can also include surveillance logic configured to arbitrate transmission between a surveillance transmitter and a distance measurement equipment transmitter. Additionally, the circuitry can include a low pass filter at the interface to the bottom omni-directional antenna. Furthermore, the circuitry can include a bandpass filter between the radio frequency splitter and the bottom omni-directional antenna.

The omni-directional antenna can be an L-band antenna. The antenna can be a monopole antenna or can include an array of antenna elements.

The surveillance receiver can include a traffic collision avoidance system receiver and/or a transponder receiver.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention.

I claim:

1. Circuitry, comprising:
   an interface to a bottom omni-directional antenna;
   a radio frequency splitter in switchable communication with the interface to the bottom omni-directional antenna;
   an interface between the radio frequency splitter and a receiver of distance measurement equipment; and
   an interface between the radio frequency splitter and a surveillance receiver;
   a switchable interface between a distance measurement equipment transmitter and the bottom omni-directional antenna;
   wherein the circuitry is configured to operate selectively in a surveillance transmit mode, a distance measurement equipment transmit mode, and a receive mode.

2. The circuitry of claim 1, further comprising:
   a plurality of diodes configured to permit operation over a communication path based on the selected surveillance transmit mode, distance measurement equipment transmit mode, or receive mode.

3. The circuitry of claim 1, further comprising:
   logic configured to prevent mutual transmission from a surveillance transmitter and the distance measurement equipment transmitter.

4. The circuitry of claim 1, further comprising:
   an interface to a surveillance transmitter, wherein the interface to the surveillance transmitter is switchably connected to the interface to the bottom omni-directional antenna.

5. The circuitry of claim 1, further comprising:
   wherein the switchable interface between a distance measurement equipment transmitter and the bottom omni-directional antenna further comprises a power amplifier for output to the bottom omni-directional antenna.

6. The circuitry of claim 1, further comprising:
   surveillance logic configured to arbitrate transmission between a surveillance transmitter and a distance measurement equipment transmitter.

7. The circuitry of claim 1, further comprising:
   a low pass filter at the interface to the bottom omni-directional antenna.

8. The circuitry of claim 1, further comprising:
   a bandpass filter between the radio frequency splitter and the bottom omni-directional antenna.

9. The circuitry of claim 1, wherein the omni-directional antenna comprises an L-band antenna.

10. The circuitry of claim 1, wherein the surveillance receiver comprises at least one a traffic collision avoidance system receiver or a transponder receiver.

* * * * *